(12) United States Patent
Kelwing et al.

(10) Patent No.: US 8,735,240 B2
(45) Date of Patent: May 27, 2014

(54) CET AND GATE CURRENT LEAKAGE REDUCTION IN HIGH-K METAL GATE ELECTRODE STRUCTURES BY HEAT TREATMENT AFTER DIFFUSION LAYER REMOVAL

(75) Inventors: Torben Kelwing, Dresden (DE); Martin Trentzsch, Dresden (DE); Boris Bayha, Dresden (DE); Carsten Grass, Dresden (DE); Richard Carter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/455,489

(22) Filed: Apr. 25, 2012

(65) Prior Publication Data

US 2013/0288435 A1 Oct. 31, 2013

(51) Int. Cl.
*H01L 21/8238* (2006.01)
(52) U.S. Cl.
USPC ..... 438/199; 438/216; 438/585; 257/E21.632
(58) Field of Classification Search
USPC ............. 438/199, 216, 287, 301, 308, 585; 257/E21.632
See application file for complete search history.

(56) References Cited

U.S. PATENT DOCUMENTS

| 8,198,192 | B2 | 6/2012 | Carter et al. | 438/623 |
| 2010/0181611 | A1* | 7/2010 | Hong et al. | 257/316 |
| 2010/0289089 | A1* | 11/2010 | Carter et al. | 257/392 |
| 2010/0327373 | A1 | 12/2010 | Carter et al. | |
| 2012/0122284 | A1* | 5/2012 | Kim et al. | 438/287 |
| 2012/0196448 | A1* | 8/2012 | Ahn et al. | 438/763 |

FOREIGN PATENT DOCUMENTS

DE 102009021486 A1 11/2010 ............. H01L 21/8238

OTHER PUBLICATIONS

Translation of Official Communication from German Patent Office for German Patent Application No. 10 2012 215 988.6 dated Jun. 5, 2013.

* cited by examiner

*Primary Examiner* — Hoai V Pham
(74) *Attorney, Agent, or Firm* — Amerson Law Firm, PLLC

(57) ABSTRACT

When forming high-k metal gate electrode structures by providing the gate dielectric material in an early manufacturing stage, the heat treatment or anneal process may be applied after incorporating work function metal species and prior to capping the gate dielectric material with a metal-containing electrode material. In this manner, the CET for a given physical thickness for the gate dielectric layer may be significantly reduced.

17 Claims, 6 Drawing Sheets

CET AND GATE CURRENT LEAKAGE REDUCTION IN HIGH-K METAL GATE ELECTRODE STRUCTURES BY HEAT TREATMENT AFTER DIFFUSION LAYER REMOVAL

BACKGROUND OF THE INVENTION

1. Field of the Invention

Generally, the present disclosure relates to sophisticated integrated circuits including advanced transistor elements that comprise complex gate electrode structures based on a high-k gate dielectric.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, the scaling of the channel length, and associated therewith the reduction of channel resistivity, is a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations produced by volume production techniques. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage without sacrificing the electrical characteristics of the interface.

For the reasons pointed out above, in field effect transistors, silicon dioxide is preferably used as a base material for a gate insulation layer that separates the gate electrode, frequently comprised of polysilicon and/or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to, among other things, an increased leakage current. Aggressively scaled transistor devices with a relatively low supply voltage, and thus reduced threshold voltage, may suffer from an exponential increase of the leakage current, since the required increased capacitive coupling of the gate electrode to the channel region is achieved by reducing the thickness of the silicon dioxide layer. For example, a channel length of approximately 80 nm may require a gate dielectric made of silicon dioxide as thin as approximately 1.2 nm. Although, the usage of high speed transistor elements having an extremely short channel may be restricted to high speed signal paths, whereas transistor elements with a longer channel may be used for less critical circuit portions, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance driven circuits, even if only transistors in speed critical paths are formed on the basis of an extremely thin gate oxide.

Therefore, various measures have been proposed for increasing the dielectric strength and the effective dielectric constant of the silicon dioxide material, such as performing treatments on the basis of nitrogen in order in incorporate a certain amount of nitrogen. Although these treatments of the base oxide material provide significant improvements, the further scaling of the transistor dimensions may demand even further sophisticated approaches. To this end, replacing silicon dioxide as the material for gate insulation layers has been considered, particularly for extremely thin silicon dioxide-based gate layers. Possible alternative materials include materials that exhibit a significantly higher permittivity so that a physically greater thickness of a correspondingly formed gate insulation layer provides a capacitive coupling that would be obtained by an extremely thin silicon dioxide-based layer. Hence, for obtaining a desired reduced capacitance equivalence thickness (CET) of the gate dielectric material of, for instance 1.2 nm or less, referring to a silicon oxide material, it has been thus suggested to replace at least a portion of the conventional silicon dioxide with high permittivity materials, such as tantalum oxide ($Ta_2O_5$), with a k of approximately 25, strontium titanium oxide ($SrTiO_3$), having a k of approximately 150, hafnium oxide ($HfO_2$), having a k of about 21, HfSiO, zirconium oxide ($ZrO_2$), $TiO_2$ and the like.

Additionally, transistor performance may be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides an increased capacitance based on the same or greater thickness as a silicon dioxide-based layer, while additionally maintaining leakage currents at an acceptable level. On the other hand, the non-polysilicon material, such as titanium nitride and the like, may be formed so as to connect to the high-k dielectric material, thereby substantially avoiding the presence of a depletion zone.

Consequently, a plurality of process strategies have been developed in order to form high-k metal gate electrode structures with appropriate work function for different types of transistors, wherein a reduced capacitance equivalent thickness (CET) is obtained that corresponds to extremely sophisticated silicon dioxide-based gate dielectric materials, while, on the other hand, the actual physical thickness may be increased in order to reduce the gate leakage currents that would otherwise be associated with the extremely silicon dioxide-based gate dielectrics. Since, typically, the high-k dielectric materials are very sensitive with respect to exposure to certain process atmospheres, in many approaches, the high-k dielectric material in combination with appropriate metal-containing electrode materials and work function metals are provided in a very late manufacturing stage in which gate electrode structures having the desired lateral dimensions are used as dummy gate electrode structures during the entire manufacturing flow for completing the basic transistor configuration. Thereafter, portions of the gate electrode structures are removed so as to expose the channel region of the different transistors in order to form thereon an appropriate gate dielectric material including a material of increased dielectric constant, followed by appropriate metal species for obtaining a desired work function and superior conductivity of the resulting gate electrode structures. Although this approach may result in a reduced CET of the gate electrode structures at acceptable gate leakage currents, very complex and complicated patterning, deposition and planarization techniques are required in order to remove unwanted gate materials and provide the various gate layers in a well-defined thickness and material composition in the gate electrode structures. For these reasons, in other very promising approaches, the high-k dielectric material in combination with appropriate metal species for defining the work function of the gate electrode structures for different types of transistors may be provided in an early manufacturing stage, wherein specific treatments of the high-k dielectric material and/or the metal layer formed thereon may be implemented in order to adjust and subsequently stabilize the characteristics of the gate electrode structures. To this end, in some approaches, the high-k dielectric material is formed on a thin silicon dioxide-based dielectric material in order to form a combined gate dielectric layer having a desired reduced CET with a physical thickness that is sufficient to retain acceptable gate leakage currents. Thereafter, adjustment of the work function for different types of transistors may be accomplished by providing different types of diffusion layers above the active regions of the different transistors in order to initiate a diffusion process on the basis of a subsequent heat treatment at temperatures of approximately 800° C. and higher, thereby efficiently driving a respective metal species into the underlying gate dielectric layer. For example, US patent application publication 2010/0327373, with the title "Uniform High-k Metal Gate Stacks by Adjusting Threshold Voltage for Sophisticated Transistors by Diffusing a Metal Species Prior to Gate Patterning," the entire disclosure of which is incorporated herein by reference, describes a process sequence in which different metal species, such as lanthanum and aluminum, may be incorporated into the gate dielectric layers of N-channel transistors and P-channel transistors by applying an efficient deposition, patterning and masking regime in order to perform a diffusion process at elevated temperatures. Thereafter, any cap layers and diffusion layers are removed and a common metal-containing electrode material, such as titanium nitride, is formed above the selectively adjusted gate dielectric layers, followed by a further electrode material, such as silicon. During the further processing, the sensitive high-k dielectric material may be efficiently encapsulated, for instance, by providing appropriate liners or sidewalls spacers, thereby substantially avoiding unwanted interaction with reactive process atmospheres, such as wet chemical cleaning processes, anneal atmospheres including a certain amount of oxygen and the like.

Generally, this so-called "gate first" approach may result in a highly efficient overall process flow since many well-established concepts, for instance with respect to gate patterning on the basis of sophisticated lithography and etch techniques, may still be used irrespective of the presence of the moderately thin high-k gate dielectric layer, while, on the other hand, extremely complex process steps with respect to replacing gate materials and forming the high-k dielectric material at a very late manufacturing stage may be avoided.

In an attempt to further reduce the CET of the gate electrode structures, any straightforward strategies, such as simply reducing the thickness of the high-k dielectric material, may concurrently increase the gate leakage currents since this may result in a reduction of the physical thickness and, thus, of the charge carrier blocking capabilities of the resulting gate dielectric materials. On the other hand, transistor performance is inversely proportional to the CET and hence corresponding reduction of CET is mandatory in further improving overall transistor performance. In this respect, it has been recognized that by exposing the high-k dielectric material to elevated temperatures, for instance of approximately 800° C. and significantly higher, the CET may be reduced, however, without unduly affecting the gate leakage current behavior of the gate dielectric material. To this end, it has been proposed to perform a heat treatment or anneal process immediately after the deposition of the high-k dielectric material in order to provide superior stability and reduced CET. Upon applying an appropriate process strategy as required in volume production techniques, however, it has turned out that the resulting improvement in CET is significantly less than expected.

In view of the situation described above, the present disclosure relates to process techniques for providing sophisticated high-k metal gate electrode structures, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the inven-tion or to delineate the scope of the invention. Its sole purpose is to present some concepts in a simplified form as a prelude to the more detailed description that is discussed later.

Generally, the present disclosure provides manufacturing techniques in which a desired reduction in CET may be achieved, while still ensuring acceptable levels for the gate leakage currents, in that a heat treatment or anneal process may be applied to the gate dielectric layer after having incorporated therein a metal species required for work function adjustment. According to the principles disclosed herein, the heat treatment or anneal process, which may be implemented on the basis of an appropriate gaseous ambient, may be performed in a substantially exposed state of the gate dielectric layer, however, after having applied a previous heat treatment required for initiating a diffusion of metal species into the gate dielectric material. It has been found that, in this manner, a significant reduction of the CET is obtained without unduly affecting the gate leakage currents.

One illustrative method disclosed herein comprises forming a gate dielectric layer on a semiconductor region of a semiconductor device, wherein the gate dielectric layer comprises a high-k dielectric material. The method further comprises forming a diffusion layer above the gate dielectric layer, wherein the diffusion layer comprises a metal species. Moreover, a first heat treatment is performed so as to diffuse a portion of the metal species into the gate dielectric layer. Additionally, the diffusion layer is removed so as to expose the gate dielectric layer. The method further comprises performing a second heat treatment on the exposed gate dielectric layer and forming an electrode material above the gate dielectric layer. Additionally, the method comprises forming a gate electrode structure of a transistor on the basis of the electrode material and the gate dielectric layer.

A further illustrative method disclosed herein comprises forming a gate dielectric layer on a first active region and a second active region of a semiconductor device. The method further comprises introducing a first metal species into a first portion of the gate dielectric layer formed on the first active region. Moreover, a second metal species is introduced into a second portion of the gate dielectric layer formed on the second active region, wherein the second metal species differs from the first metal species. The method further comprises exposing the gate dielectric layer to a gaseous ambient by performing a heat treatment and forming an electrode material of the heat treated gate dielectric layer.

A still further illustrative method disclosed herein comprises forming a gate dielectric layer on an active region of a semiconductor device so as to comprise a high-k dielectric material. The method further comprises performing a first post-deposition heat treatment on the gate dielectric layer. Moreover, the method comprises forming a diffusion layer above the gate dielectric layer after performing the post-deposition heat treatment and inducing diffusion of a threshold voltage adjusting species into the gate dielectric layer. Moreover, the method comprises exposing the gate dielectric layer by removing at least the diffusion layer and performing a heat treatment on the exposed gate dielectric layer. Moreover, at least one metal-containing layer is formed above the gate dielectric layer after performing the heat treatment. Additionally, the method comprises performing a second post-deposition heat treatment on the at least one metal-containing layer.

BRIEF DESCRIPTION OF THE DRAWINGS

The disclosure may be understood by reference to the following description taken in conjunction with the accompanying drawings, in which like reference numerals identify like elements, and in which.

Figure 1A:
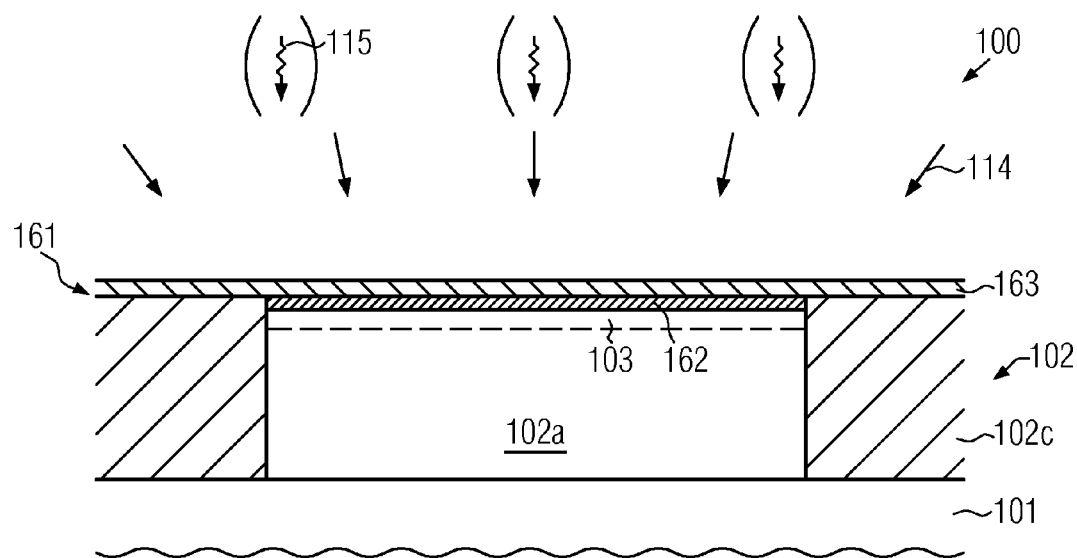
FIGS. 1a-1g schematically illustrate cross-sectional views of a semiconductor device during various manufacturing stages when forming a high-k metal gate electrode structure on the basis of a heat treatment or anneal process applied to the exposed gate dielectric layer after the incorporation of a work function metal species, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques for semiconductor devices in which, alternatively or additionally to heat treatments performed in the context of providing a high-k metal gate electrode structure, at least one heat treatment may be implemented after the incorporation of a work function adjusting species when the gate dielectric layer is still in a substantially exposed state prior to forming thereon any further material layers, such as metal-containing electrode materials and the like. It has been recognized that implementing a heat treatment at this point of the overall manufacturing flow may result in a reduced CET without significantly affecting the leakage current blocking effect of the gate dielectric layer. Moreover, on the basis of the heat treatment performed at this specific stage of the manufacturing process, additional degrees of freedom are provided with respect to finely tuning the work function of gate electrode structures, for instance, by selecting an appropriate gaseous ambient and other process parameters of the heat treatment, such as duration, process temperature and the like. To this end, a plurality of appropriate anneal techniques are available which may be applied to the gate dielectric layer in a substantially exposed stage after the incorporation of the work function metal species. For example, typical rapid thermal anneal (RTA) techniques may be applied with appropriate temperatures, for instance in the range of 400-900° C. and higher for a duration of approximately 15 seconds to several minutes and even longer, if considered appropriate, while, in other cases, sophisticated laser-based or flashlight-based anneal techniques may be applied. In this manner, locally differing anneal parameters may be applied, for instance by varying exposure time to a specific radiation, which may thus enable a different setting of device parameters in specific device areas, for instance with respect to threshold voltage of transistors and the like.

In particular, when combining the heat treatment performed after incorporation of the metal species and prior to depositing any electrode materials with other heat treatments, such as a post-deposition anneal process, applied to the gate dielectric material after deposition thereof and/or a post-deposition anneal process applied after the deposition of one or more electrode material layers, a high degree of flexibility in adjusting the final device parameters may be obtained, while, at the same time, high stability of the electronic characteristics of the gate electrode structures may be achieved. In this manner, for a given level of leakage current, a reduced CET may be accomplished, thereby enhancing overall transistor performance, while, in other cases, for a given CET, the gate leakage currents may be significantly reduced.

FIG. 1a schematically illustrates a cross-sectional view of a semiconductor device 100 comprising a substrate 101 above which may be formed a semiconductor layer 102. The substrate 101 may be any appropriate carrier material for forming thereon the semiconductor layer 102, which in turn may comprise any appropriate semiconductor material for forming therein and thereabove transistor devices and the like. It should be appreciated that the semiconductor layer 102 in this manufacturing stage may comprise a plurality of isolation regions 102c, for instance provided in the form of shallow trench isolations and the like. Moreover, in some embodiments, an insulating buried layer (not shown) may be provided, at least in some areas of the substrate 101, so as to "vertically" delineate the semiconductor layer 102 from any lower lying substrate materials. Hence, in such areas including a buried insulating layer, the substrate 101 in combination with the semiconductor layer 102 may form an SOI (silicon-on-insulator) configuration. In other cases, the semiconductor layer 102 may directly connect to a semiconductor material of the substrate 101. Furthermore, the isolation structures 102c may laterally delineate a plurality of semiconductor regions or active regions, wherein, for convenience, a single active region 102a is illustrated in FIG. 1a. Generally, an active region is to be understood as a semiconductor region in which PN junctions of at least one transistor are to be formed. For example, the active region 102a may comprise any appropriate type of semiconductor material, such as silicon, silicon/germanium and the like, in order to provide the basic electronic characteristics required for the transistor under consideration. As indicated by a layer 103, appropriate materials may be provided so as to obtain the desired transistor characteristics. For example, the layer 103 may be provided in the form of a semiconductor alloy, such as a silicon/germanium alloy, in order to obtain appropriate electronic characteristics of a channel region of a transistor still to be formed. Furthermore, it should be appreciated that hereinafter a planar transistor architecture is referred to in which a substantially two-dimensional channel region is controlled by an adjacent gate electrode structure. The principles disclosed herein, however, may also be applied to any other transistor architecture, such as three-dimensional transistors in the form of FinFETs and the like.

In the manufacturing stage shown, the device 100 may further comprise a gate dielectric layer 161, which may comprise a high-k dielectric material 163, such as one or more of the materials discussed above. In the embodiment shown, the high-k dielectric material 163 may be provided in the form of a sub-layer of the gate dielectric layer 161, which may be formed on a dielectric base layer 162, which may be provided in the form of a conventional dielectric material, such as a silicon dioxide base material. It should be appreciated that the material 162 may comprise other components, such as nitrogen and the like, in order to provide the required interface characteristics and material stability during the further processing. Furthermore, in the embodiment shown in FIG. 1a, it may be assumed that the dielectric base layer 162 may be formed on the active region 102a without laterally extending into the isolation regions 102c. In other cases (not shown), the base layer 162 may also extend above at least a portion of the isolation structure 102c.

The semiconductor device 100 as shown in FIG. 1a may be formed on the basis of the following processes. The active region 102a and the isolation structures 102c may be formed on the basis of any appropriate process strategy, for instance by forming trenches in the semiconductor layer 102 and refilling the trenches with an appropriate dielectric material, such as silicon dioxide, silicon nitride and the like. Prior to or after forming the isolation structures 102c, appropriate dopant species may be incorporated into the semiconductor layer 102, possibly in combination with appropriate materials, such as the layer 103, in order to provide the basic electronic characteristics of the active region 102a. Thereafter, the sub-layer 162 of the gate dielectric layer 161 may be formed, for instance by sophisticated oxidation techniques in combination with other surface treatments and the like, in order to form a base dielectric material having appropriate thickness and characteristics. For example, in sophisticated applications, the layer 162 may be provided with a thickness of 10 Å or less in order to enable the implementation of a CET of 12 Å and less, whereas the physical thickness of the gate dielectric layer 161 may be significantly greater in order to retain the leakage currents at an acceptable level. Thereafter, the sub-layer 163 comprising the high-k dielectric material may be deposited by applying well-established deposition techniques 114, such as atomic layer deposition (ALD) and the like, in order to provide an appropriate high-k dielectric material, such as hafnium oxide and the like, with a thickness that is appropriate in combination with the characteristics of the layer 162 to define the initial CET and physical thickness, wherein, as discussed above, a significant reduction of the CET may still be achieved in a later manufacturing stage, however, without unduly altering the physical thickness. In some illustrative embodiments, a post-deposition anneal process 115 may be performed after the deposition process 114 and prior to depositing any other materials. For example, the optional anneal process 115 may be carried out in the presence of any appropriate process ambient at a process temperature of 600° C. and higher. For example, a process atmosphere may be established by using argon, nitrogen, oxygen, ammonia, a mixture of nitrogen and hydrogen, pure hydrogen and the like. It should be appreciated that establishing a gaseous ambient by using, or on the basis of, one or more of the above-identified process gases is to be understood herein in such a manner that a gas ambient established on the basis of a single gas component may include only minute amounts of other gases. For example, an oxygen gas ambient is to be understood as a process atmosphere in which at least ninety five percent of the gas is oxygen gas. Similarly, if a combination of gas components, such as nitrogen and hydrogen, are used to establish a gas ambient according to the disclosure herein, at least ninety five percent of the entire gas volume contains a hydrogen/nitrogen mixture, wherein each gas species is present with at least ten percent.

It should be appreciated that the optional anneal process 115 may be implemented on the basis of any appropriate process parameters and on the basis of a gaseous ambient as discussed above, wherein the corresponding process parameters and the composition of the corresponding gaseous ambient may be selected in accordance with the overall device requirements and such process parameters may be readily determined on the basis of experiments.

Figure 1B:
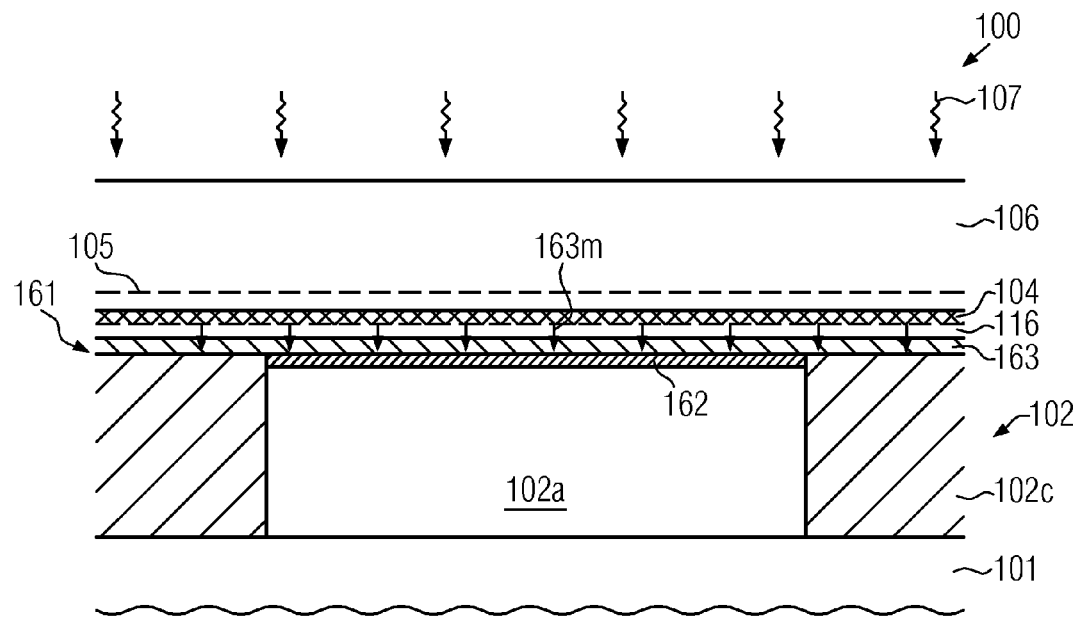

FIG. 1*b* schematically illustrates the device 100 in a further advanced manufacturing stage. As illustrated, a diffusion layer 104 may be formed above the gate dielectric layer 161, possibly in combination with an intermediate cap layer 116, which may be comprised of any appropriate material, such as titanium nitride and the like. On the other hand, the diffusion layer 104 may comprise appropriate metal species 163*m* which may be incorporated with a desired concentration in the gate dielectric layer 161, for instance at least in the layer 163, so as to appropriately adjust the work function of the gate electrode structure still to be formed. For example, lanthanum is a metal species that may be efficiently used for adjusting the work function for gate electrode structures of N-channel transistors, while aluminum may be efficiently used as a work function metal species for P-channel transistors. Moreover, an optional cap layer 105, such as a titanium nitride layer and the like, may be formed above the diffusion layer 104, followed by a further cap layer 106, such as a silicon layer and the like. It should be appreciated that the layer 104 and the optional layers 116 and 105 may be provided with any appropriate thickness so as to adjust a desired diffusion behavior during a further heat treatment or anneal process 107. For example, the optional cap layer 116 may be provided with a thickness of 0-10 Å or significantly greater, while the diffusion layer 104 may be provided with a thickness of one to several Å. Similarly, any appropriate thickness may be used for the cap layer 105, if provided. During the anneal process 107, which may be performed at a temperature of approximately 900° C. and higher, diffusion of the species 163*m* is initiated so as to populate at least the layer 163.

Figure 1C:
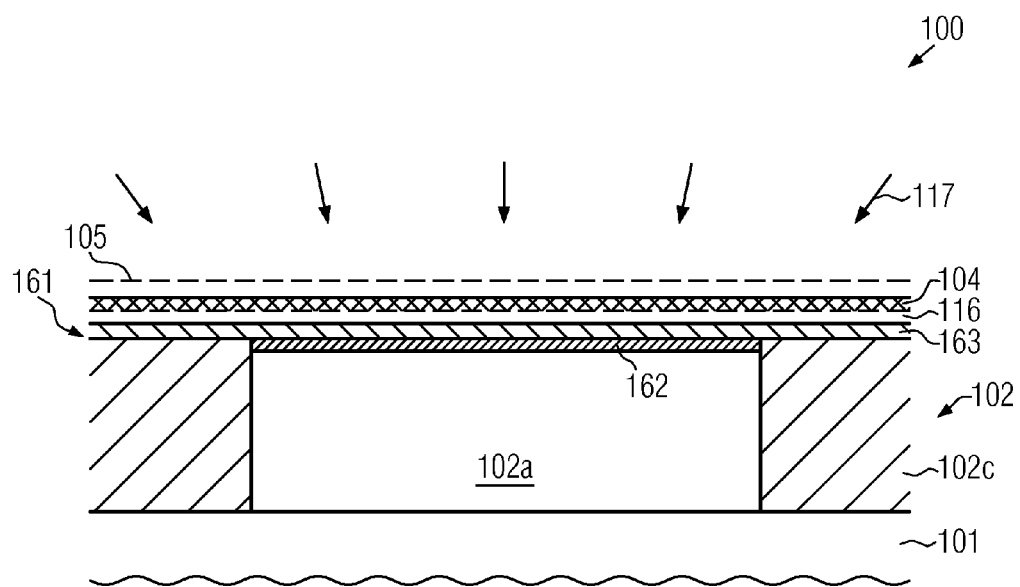

FIG. 1*c* schematically illustrates the device 100 when exposed to an etch ambient 117, for instance based on ammonium hydroxide, in order to remove the cap layer 106 (FIG. 1*b*). Hence, during the process 117, metal-containing material layers, such as the optional cap layer 105, may be exposed.

Figure 1D:
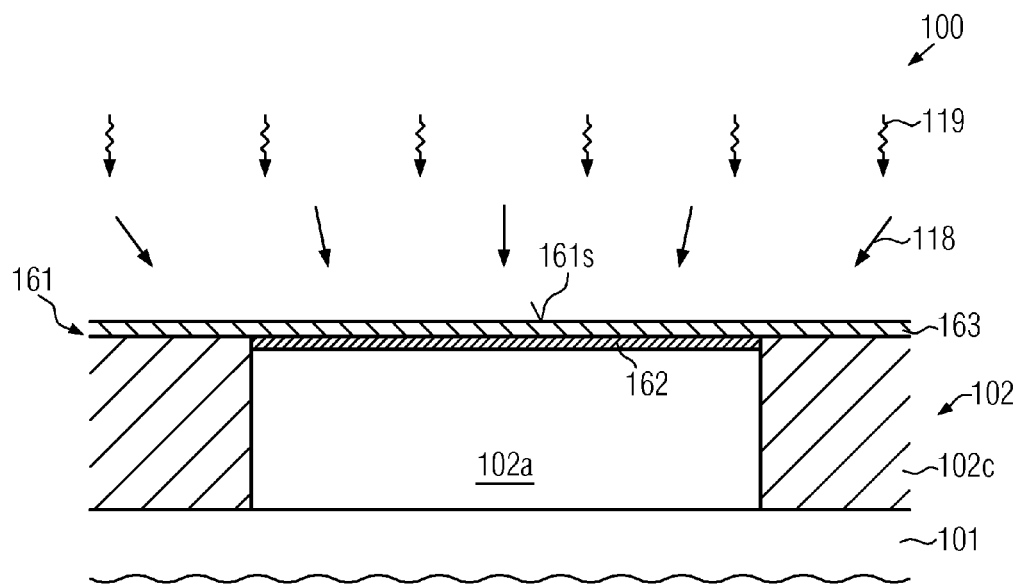

FIG. 1*d* schematically illustrates the semiconductor device 100 in a further advanced manufacturing stage in which a further etch process 118 may be applied so as to remove any metal materials, such as the layers 116, 104 and 105 (FIG. 1*c*), thereby exposing a surface 161*s* of the gate dielectric layer 161. To this end, any appropriate etch chemistry may be applied, such as an ammonium hydrogen peroxide mixture (APM), which may efficiently remove the metal-containing materials while not unduly affecting the high-k dielectric material 163. Thereafter, a further heat treatment or anneal process 119 may be applied to the gate dielectric layer 161 without forming other materials thereon. In this manner, the previously annealed layer 161 may be exposed to any appropriate gaseous ambient, such as an argon ambient, a nitrogen ambient, an oxygen ambient, a hydrogen ambient, a hydrogen/nitrogen ambient, an oxygen rich ambient and the like, on the basis of an appropriate elevated temperature of 400° C., for an oxygen ambient and oxygen rich ambient, to about 900° C. and higher, thereby obtaining a significant reduction of the CET, which is to be understood as an increase of the effective dielectric constant without a significant change of the physical thickness of the gate dielectric layer 161. With respect to selecting an appropriate process atmosphere and process parameters of the heat treatment 119, the same criteria may apply as previously discussed above with reference to the heat treatment 107 (FIG. 1*b*). That is, the respective process parameters may be selected so as to obtain a desired improvement of the capacitive behavior of the gate dielectric layer 161, which may be verified on the basis of corresponding experiments. Similarly, appropriate process gases may be selected on the basis of experiments. Furthermore, as discussed above, different anneal techniques may be applied, such as laser-based anneal techniques, RTA techniques and the like, thereby providing a high degree of flexibility in appropriately adjusting the electronic characteristics of the layer 161 and meeting specific requirements with respect to the overall process flow. Moreover, if desired, locally differing process parameters may be applied during the heat treatment 119, if considered appropriate for implementing different work function and threshold voltage characteristics in different device areas.

Figure 1E:
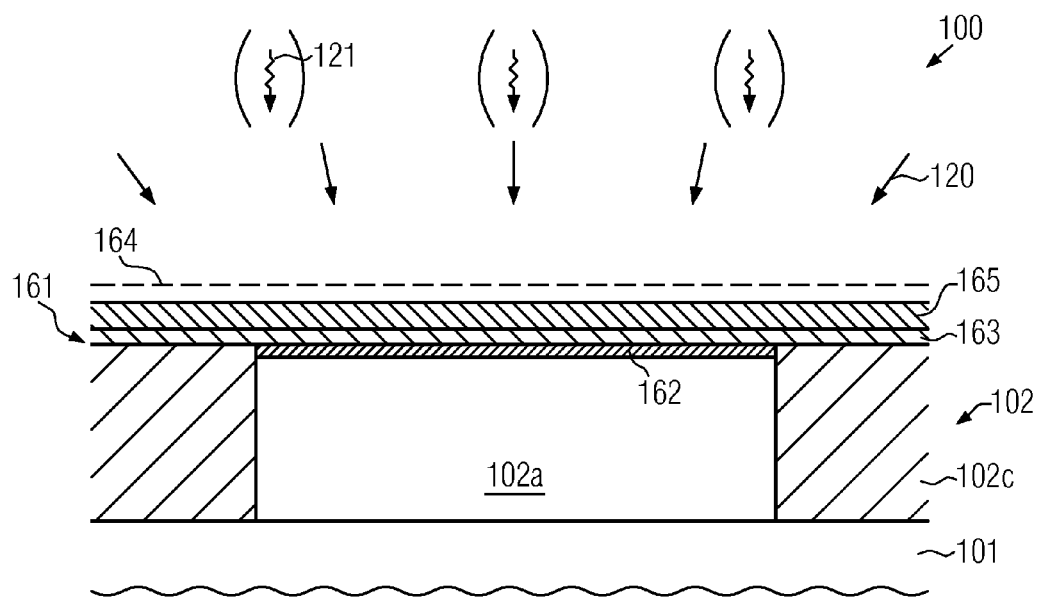

FIG. 1*e* schematically illustrates the device 100 in a further advanced manufacturing stage in which at least one layer of metal-containing electrode material 165 may be formed on the gate dielectric layer 161. For example, titanium nitride is a well-established electrode material that may be efficiently used in the context of high-k metal gate electrode structures. To this end, any well-established deposition techniques may be applied so as to form the layer 165 with any appropriate material composition and thickness. It should be appreciated that one or more additional metal-containing electrode materials may be provided, for instance as indicated by 164, if considered appropriate for the overall configuration of the gate electrode structure still to be formed. Hence, any appropriate deposition process technique 120 may be applied so as to form one or more metal-containing electrode materials, for instance the layer 165 and the layer 164.

In some illustrative embodiments, an optional post-deposition heat treatment or anneal process 121 may be applied after the deposition process 120 in order to further adjust the overall characteristics of the finally obtained gate electrode structure. The anneal process 121 may be performed on the basis of process temperatures in the range of 600° C. and higher, while also, if desired, any appropriate process atmosphere may be established. It should be appreciated that at least the layer 165 covers the gate dielectric layer 161, in particular the high-k dielectric material 163 having incorporated therein a work function metal species, as discussed above, and which has experienced the previous heat treatment 119 (FIG. 1d). In this case, the total effect of the heat treatment 121 may not affect the high-k dielectric material 163 in an unwanted manner since, for instance, a direct exposure to any gas ambient is oppressed by the layer 165 and the one or more optional layers 164.

Figure 1F:
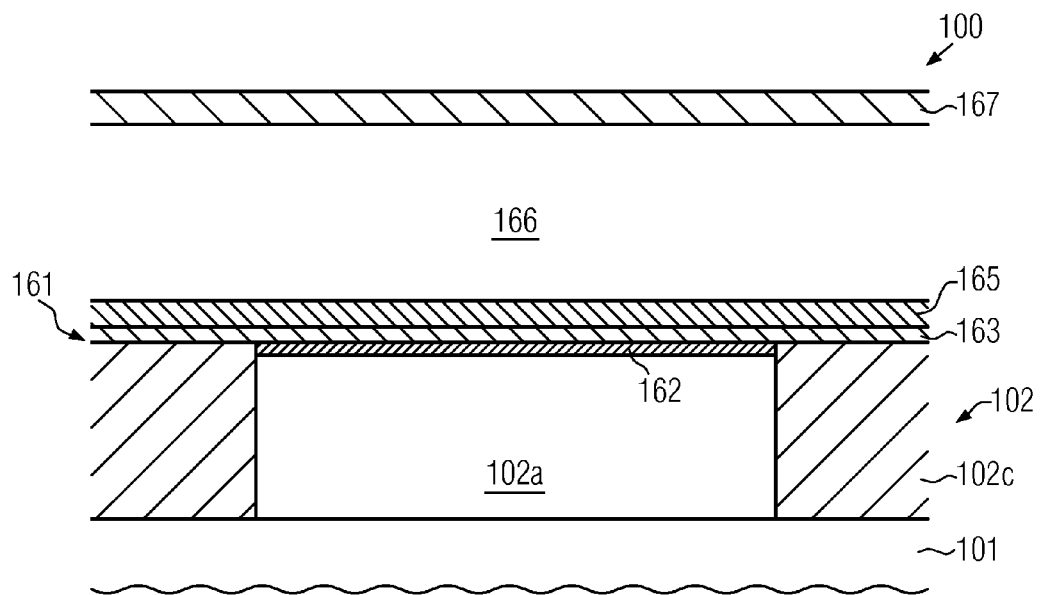

FIG. 1f schematically illustrates the device 100 in a further advanced manufacturing stage. As shown, a further electrode material 166, such as a silicon material, a silicon/germanium material and the like, may be formed on or above the metal-containing electrode material 165, followed by any further sacrificial layers 167, which may be required for patterning the resulting layer stack and continuing the manufacturing process. For example, the sacrificial layer 167 may be comprised of silicon dioxide, silicon nitride and the like. The layers 166 and 167 may be formed on the basis of any separate deposition technique.

Figure 1G:
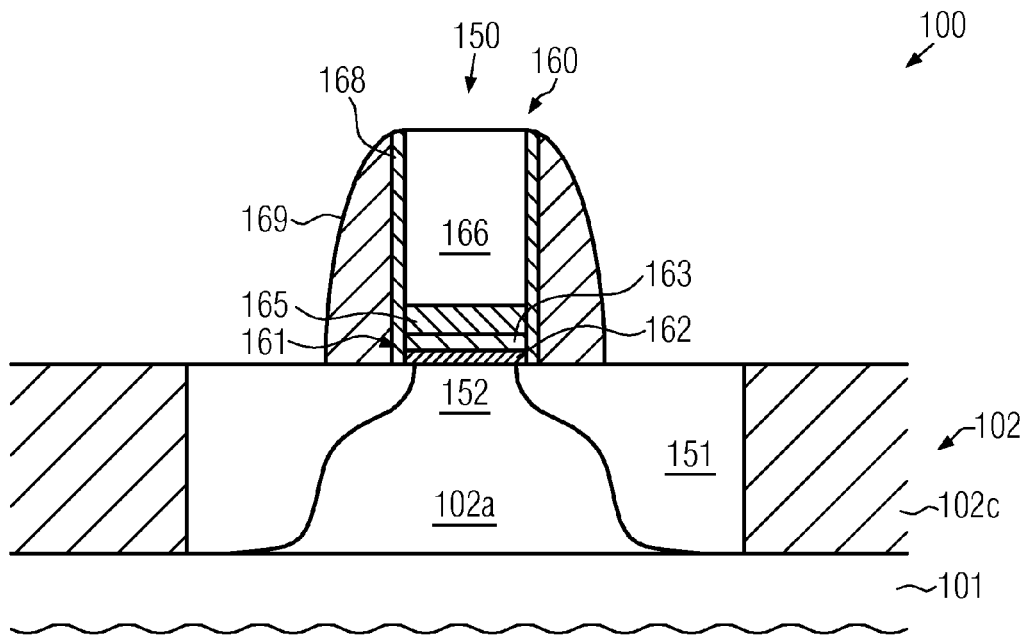

FIG. 1g schematically illustrates the device 100 in a still further advanced manufacturing stage. As shown, a transistor 150 may be formed in and above the active region 102a and may comprise thereon drain and source regions 151 of any appropriate lateral and vertical dopant profile, with a channel region 152 formed between the drain and source regions 151. As previously discussed, the transistor 150 may represent a planar transistor architecture, while, in other cases, a three-dimensional device may be formed by using the principles discussed herein. Furthermore, the transistor 150 may comprise a gate electrode structure 160 comprising the gate dielectric layer 161 in the form of dielectric base material 162 and the high-k dielectric material 163, followed by the metal-containing electrode material 165 and the further electrode material 166. Furthermore, in particular the sensitive material layer 161 may be laterally confined by a spacer or liner 168, for instance comprised of silicon nitride, while also a further spacer structure 169 may provide superior integrity of sensitive gate material.

The transistor 150 may be formed on the basis of any appropriate process technique which involves the patterning of the gate electrode structure 160 starting with the layer stack as shown in FIG. 1f. To this end, sophisticated lithography and patterning techniques may be applied to form the layer stack into appropriate lateral dimensions as required by the overall design rules. It should be appreciated that a typical gate length, i.e., the horizontal extension of the electrode material 165 in FIG. 1g, may be 40 nm and less in a planar transistor architecture. After the patterning of the gate electrode structure so as to define the desired gate length, the liner or spacer 168 may be formed, for instance by appropriate deposition techniques, in order to provide superior integrity of materials 161 and 163 during the further processing. Thereafter, additional processes may be applied in order to implement performance enhancing mechanisms in the active region 102a which, for convenience, are not shown in FIG. 1g. For example, a strain-inducing semiconductor alloy may be provided in a portion of the active region 102a in order to create a desired type and magnitude of strain in the channel region 152. Next, the drain and source regions 151 may be formed, possibly in combination with the spacer structure 169, by applying epitaxial growth techniques and/or implantation processes in combination with anneal processes and the like. The further processing may be continued by increasing conductivity of exposed semiconductor materials such as the drain and source regions 151 and the electrode material 166 if required, for instance by forming therein a metal/semiconductor compound. Thereafter, an interlayer dielectric material (not shown) may be provided so as to encapsulate the transistor 150 so as to ensure integrity thereof upon forming a metallization system.

It should be appreciated that, in some illustrative embodiments, the material 166 may be removed and may be replaced by electrode material of superior conductivity, such as aluminum, aluminum alloy and the like, if considered appropriate for the further processing. Also in this case, the basic electronic characteristics are determined by the gate dielectric material 161 and the electrode material 165.

Figure 1H:
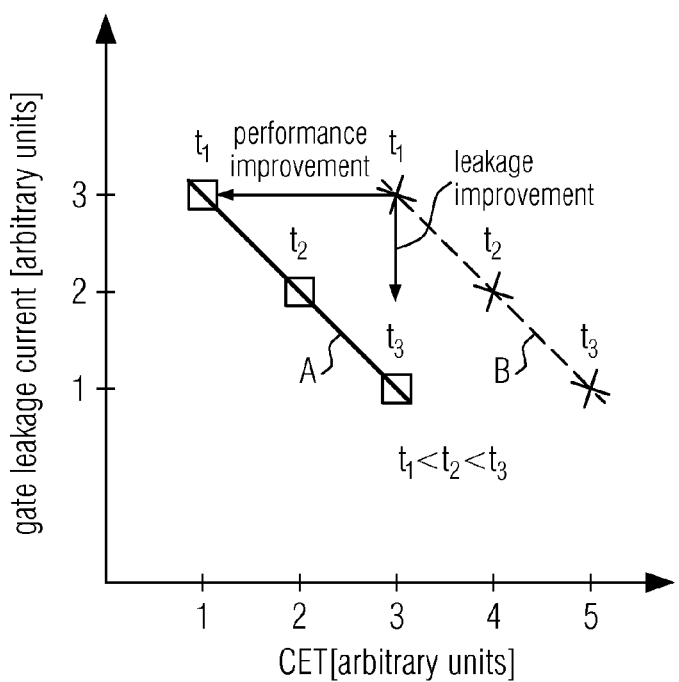
FIG. 1h schematically illustrates a graph that depicts CET and gate leakage currents for a conventional transistor and a transistor formed on the basis of the principles disclosed herein.

FIG. 1h schematically illustrates a graph that demonstrates the gate leakage current behavior versus the CET implemented in sophisticated transistor devices. Curve B represents the behavior of a conventional high-k metal gate transistor, for instance a transistor as shown in FIG. 1g, however, without implementing the heat treatment 119 as shown and explained in FIG. 1d. For example, three different physical thickness values $T_1$, $T_2$, $T_3$ have been implemented in corresponding transistor devices, wherein the increase of physical thickness is achieved by correspondingly increasing the thickness of the high-k dielectric material. Thus, for a physical thickness $T_1$, a certain CET is obtained, thereby providing a certain transistor performance, as discussed above. At the same time, the physical thickness $T_1$ is associated with a specific gate leakage current level which directly influences the static power consumption of a corresponding transistor. As explained above, by advancing to an increased physical thickness $T_2$, the leakage current is reduced, however, at the cost of an increased CET, thereby reducing transistor performance for the benefit of superior reliability. Similarly, by further increasing the physical thickness to a value $T_3$, the leakage current may further be reduced, however, at the cost of an even further increased CET and thus reduced performance. Curve A represents the corresponding behavior of transistor devices formed in accordance with the manufacturing sequence as shown in FIGS. 1a-1g, i.e., by implementing at least the heat treatment 119 of FIG. 1d. In this case, for the physical thickness $T_1$, which results in substantially the same gate leakage current level as for the conventional transistor of curve B, a significantly reduced CET is obtained, thereby resulting in a performance improvement, as indicated in FIG. 1h. Similarly, retaining a desired physical thickness, such as $t_2$, $t_3$ and the like, and implementing the heat treatment 119 of FIG. 1d may result in a corresponding performance improvement by reducing the CET corresponding to the specific physical thickness, while retaining the gate leakage current substantially at the same level. If, on the other hand, a certain performance of a conventional device is to be implemented in a transistor according to the present disclosure, for instance a CET as associated with $t_1$ of curve B, a corresponding increase of the physical thickness is allowable since, in curve A, a corresponding physical thickness is between $t_2$ and $t_3$. Due to the possibility of increasing the physical thickness while yet ensuring the same CET, a significant reduction in gate leakage currents may be achieved. Similarly, if accepting only a moderate increase of the physical thickness compared to a conventional device, performance improvement and leakage improvement may be accomplished at the same time.

As a consequence, by performing the heat treatment 119, for instance in addition to or alternatively to the heat treatments 107 and/or 121, superior performance and/or leakage improvement may be achieved compared to conventional strategies, while also additional flexibility in tuning the overall transistor characteristics may be obtained, without unduly complicating the overall manufacturing flow.

With reference to FIGS. 2a-2d, further illustrative embodiments will now be described in which work function adjustment in different types of transistors may be accomplished.

Figure 2A:
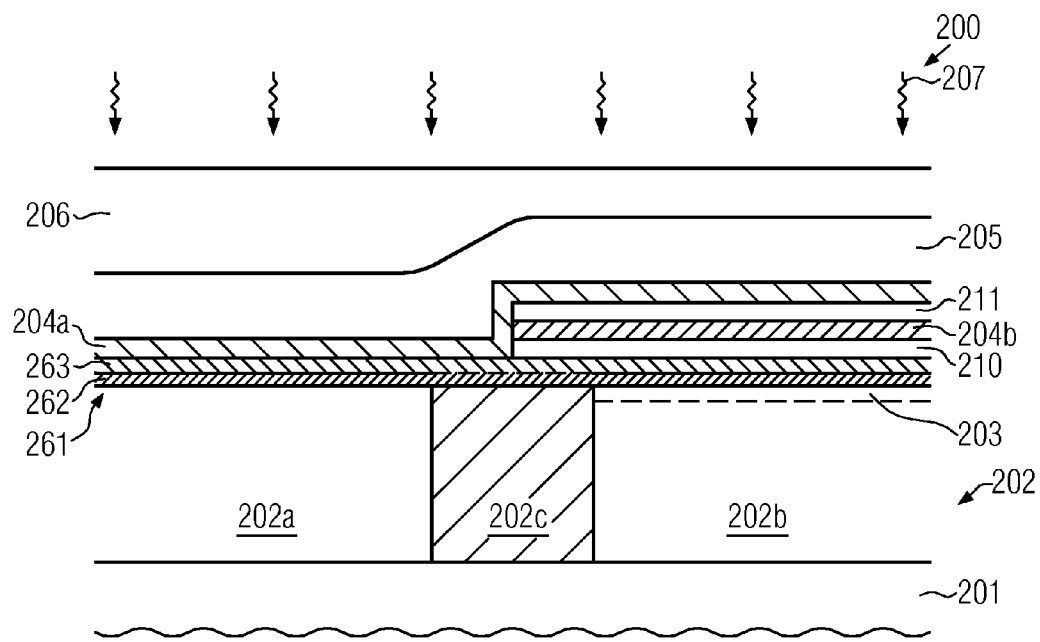
FIGS. 2a-2d schematically illustrate cross-sectional views of a semiconductor device during various manufacturing stages in which high-k metal gate electrode structures may be formed on the basis of different work function metal species in combination with a heat treatment, according to further illustrative embodiments.

FIG. 2a schematically illustrates a cross-sectional view of a semiconductor device 200 comprising a substrate 201 and a semiconductor layer 202 having formed therein active regions 202a, 202b, which are laterally delineated by an isolation structure 202c. Furthermore, one or both of the active regions 202a, 202b may comprise appropriate semiconductor materials in order to further adapt the overall electronic characteristics, for instance with respect to threshold voltage and the like. For example, a semiconductor alloy 203, such as a silicon/germanium alloy, may be formed in the active region 202b. In this case, the active region 202b may be appropriate for forming therein and thereabove a P-channel transistor. On the other hand, the active region 202a may be appropriately configured to form therein an N-channel transistor or a P-channel transistor of different type compared to the active region 202b, for instance in terms of threshold voltage and the like. Moreover, a gate dielectric layer 261 may be formed on the active regions 202a, 202b and may comprise a dielectric base material 262 in combination with a high-k dielectric material 263.

With respect to the components described so far, the same criteria may apply as previously discussed with reference to the semiconductor device 100.

Furthermore, a diffusion layer 204b may be formed above a portion of the gate dielectric layer 261 positioned above the active region 202b, while a diffusion layer 204a may be formed above a portion of the gate dielectric layer 261 positioned on the active region 202a. It should be appreciated that the diffusion layer 204a may also be formed above the active region 202b, however, with a significantly greater vertical offset compared to the diffusion layer 204b. Furthermore, an optional cap layer may be formed between the diffusion layer 204a and the gate dielectric layer 261, which for convenience is not shown in FIG. 2a. Similarly, the diffusion layer 204b may be positioned between a cap layer 210 and a cap layer 211, if considered appropriate with respect to adjusting the diffusion behavior of corresponding metal species contained in the layer 204b. Furthermore, a further cap layer 205, such as a titanium nitride layer, may be formed above the diffusion layer 204a, followed by a further cap layer 206, such as a silicon layer and the like.

The layers 210, 204b and 211 may be formed on the basis of any appropriate deposition technique, as is also discussed above with reference to FIG. 1c when referring to the semiconductor device 100 and the layers 116, 104 and 105. For example, the diffusion layer 204b may be provided in the form of an aluminum layer or an aluminum-containing layer, while the layers 210, 211 may be formed as titanium nitride layers having any appropriate thickness so as to determine, in combination with the process parameters of an anneal process 207, the diffusion behavior of the aluminum species into the gate dielectric layer 261. Thereafter, the resulting layer stack may be patterned by using lithography techniques and respective etch chemistries, wherein the gate dielectric layer 261, that is, the high-k dielectric material 263, may be used as an efficient etch stop material. Thereafter, any optional cap layer (not shown) and the diffusion layer 204a may be deposited, for instance in the form of a lanthanum layer and the like, followed by the deposition of the cap layers 205 and 206 using well-established process techniques. Hence, during the subsequent anneal process 207, a metal species such as lanthanum may migrate to the gate dielectric layer 261 positioned on the active region 202a, while the metal species in the diffusion layer 204b, such as aluminum, may diffuse into the gate dielectric layer 261 formed on the active region 202b.

Figure 2B:
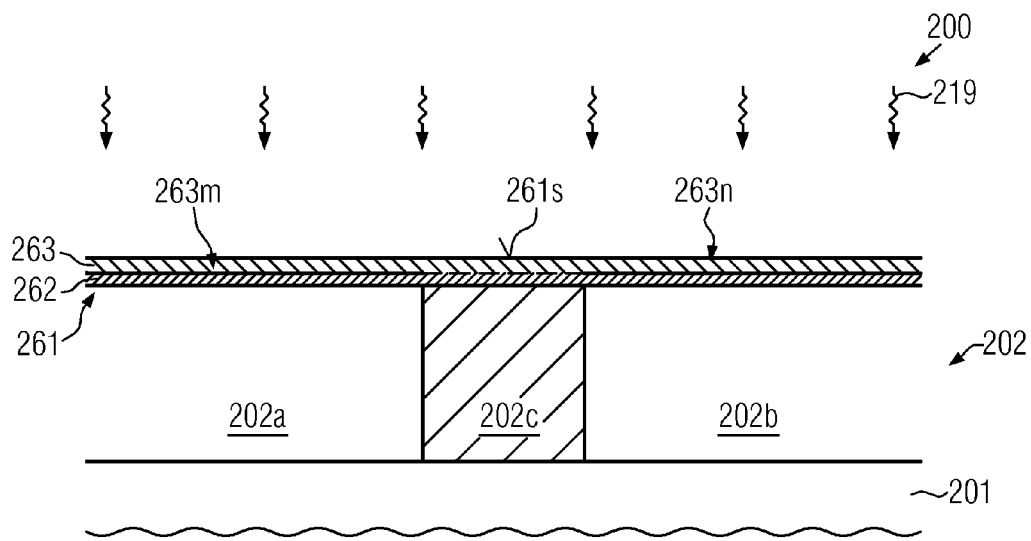

FIG. 2b schematically illustrates the device 200 in a further advanced manufacturing stage in which the cap layers 206, 205 and the layers 211, 204b, 204a, 210 (FIG. 2a) have been removed on the basis of appropriate etch processes, as are also discussed above with reference to the device 100. Consequently, a surface 261s of the gate dielectric layer 261 is exposed having incorporated therein a metal species 263m above the active region 202a and a metal species 263n above the active region 202b. Next, a heat treatment or anneal process 219 may be performed on the basis of process techniques and gaseous ambient as already discussed above with reference to the semiconductor device 100. Hence, during the process 219, the CET may be reduced without unduly affecting the overall physical thickness of the gate dielectric layer 261, as discussed above.

Figure 2C:
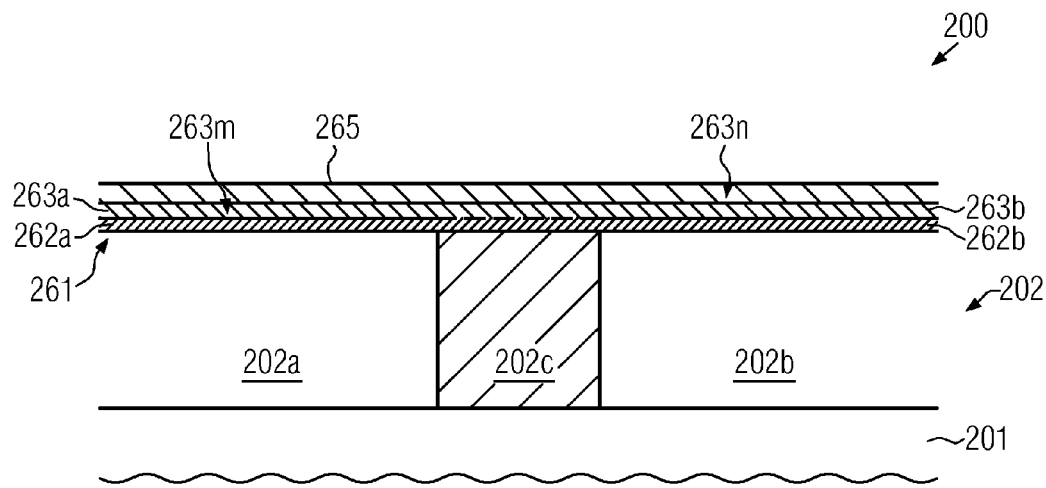

FIG. 2c schematically illustrates the device 200 in a further advanced manufacturing stage in which at least one metal-containing electrode material 265 may be formed on the gate dielectric layer 261. To this end, any well-established material, such as titanium nitride and the like, may be used. It should be appreciated that one or more additional metal-containing electrode materials may be formed above the gate dielectric layer 261 if required for the overall device characteristics.

Figure 2D:
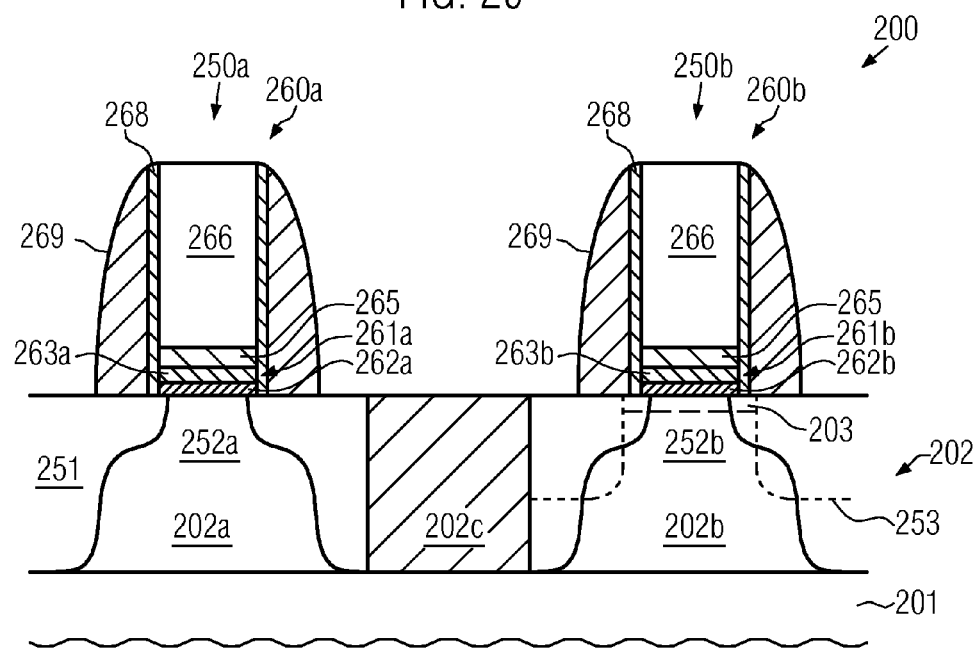

FIG. 2d schematically illustrates the device 200 in a further advanced manufacturing stage. As shown, a first transistor 250a may be formed in and above the active region 202a and may comprise drain and source regions 251 and a channel region 252a. Similarly, a second transistor 250b may be formed in and above the active region 202b and may comprise drain and source regions 251 and a corresponding channel region 252b, which may have incorporated therein additional threshold adjusting mechanisms, such as the semiconductor alloy 203 and the like. Furthermore, one or both of the transistors 250a, 250b may have implemented therein a strain-inducing mechanism, for instance in the form of a strain-inducing semiconductor alloy, as, for instance, shown for the transistor 250b in the form of a strain-inducing semiconductor alloy 253. Furthermore, the transistor 250a may comprise a gate electrode structure 260a including a gate dielectric layer 261a, which may represent a respective portion of the gate dielectric layer 261 of FIG. 2c including a base material 262a and a high-k dielectric material 263a having incorporated therein an appropriate metal species, as discussed above. Moreover, the metal-containing electrode material 265 and a further electrode material 266, such as a semiconductor material, may be provided above the gate dielectric layer 261a. Furthermore, a liner 268 and a sidewall spacer structure 269 may be formed on sidewalls of the gate electrode structure 260a. Similarly, a gate electrode structure 260b of the transistor 250b may comprise a gate dielectric layer 261b, which may represent a corresponding portion of the layer 261 of FIG. 2c comprising a base dielectric material 262b and a high-k dielectric material 263b having incorporated therein an appropriate metal species, as discussed above. Moreover, the gate electrode structure 260b may comprise the components 265, 266, 268 and 269.

The gate electrode structures 260a, 260b and the transistors 250a, 250b may be formed on the basis of process techniques as are already discussed above with reference to the semiconductor device 100. Hence, the transistors 250a, 250b may be formed in a very efficient manufacturing flow while still enabling a different adjustment of work function for different types of transistors, while each type of transistor may have superior transistor performance and/or superior gate leakage behavior due to the heat treatment 219 of FIG. 2b, as is also discussed above with reference to the device 100 and FIG. 1h.

As a result, the present disclosure provides manufacturing techniques for improving gate leakage behavior and/or transistor performance in devices comprising a high-k metal gate electrode structure, wherein at least the sensitive gate dielectric materials may be provided in an early manufacturing stage, i.e., prior to patterning the gate electrode structures. To this end, an efficient heat treatment at elevated temperatures, for instance at temperatures of 400° C. and higher, may be applied after incorporating the work function metal species and prior to depositing any further gate materials. Hence, superior scalability of high-k metal gate electrode structures may be achieved without unduly complicating the overall manufacturing process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a gate dielectric layer on a semiconductor region of a semiconductor device, said gate dielectric layer comprising a high-k dielectric material;
forming a diffusion layer above said gate dielectric layer, said diffusion layer comprising a metal species;
performing a first heat treatment so as to diffuse a portion of said metal species into said gate dielectric layer;
removing said diffusion layer so as to expose said gate dielectric layer;
performing a second heat treatment on said exposed gate dielectric layer;
forming at least one metal-containing electrode material layer above said gate dielectric layer;
performing a third heat treatment on said at least one metal-containing electrode material layer;
after performing said third heat treatment, forming at least one layer of a further electrode material above said at least one metal-containing electrode material layer; and
forming a gate electrode structure of a transistor on the basis of said at last one layer of said further electrode material, said at least one metal-containing electrode material layer, and said gate dielectric layer.

2. The method of claim 1, wherein performing a second heat treatment on said exposed gate dielectric layer comprises annealing said gate dielectric layer at a temperature of 400° C. or higher.

3. The method of claim 2, wherein performing said second heat treatment on said exposed gate dielectric layer comprises establishing a gaseous ambient using at least one of argon, nitrogen, oxygen, hydrogen, ammonia and a hydrogen/nitrogen mixture.

4. The method of claim 1, further comprising forming a cap layer above said diffusion layer and performing said first heat treatment in the presence of said cap layer.

5. The method of claim 4, wherein said cap layer is formed so as to comprise at least one of silicon and a metal-containing material.

6. The method of claim 1, wherein said metal species in said diffusion layer comprises one of lanthanum and aluminum.

7. The method of claim 1, further comprising performing a post-deposition heat treatment after forming said gate dielectric layer and prior to forming said diffusion layer.

8. The method of claim 7, wherein performing said post-deposition heat treatment comprises establishing a gaseous ambient using at least one of argon, nitrogen, oxygen, hydrogen, ammonia and a hydrogen/nitrogen mixture.

9. A method, comprising:
forming a gate dielectric layer on a first active region and a second active region of a semiconductor device;
introducing a first metal species into a first portion of said gate dielectric layer formed on said first active region;
introducing a second metal species into a second portion of said gate dielectric layer formed on said second active region, said second metal species differing from said first metal species;
exposing said gate dielectric layer to a gaseous ambient by performing a first heat treatment;
forming an electrode material on said heat-treated gate dielectric layer, wherein forming said electrode material comprises forming a layer of a metal-containing material on said gate dielectric layer;
performing a second heat treatment on said layer of a metal-containing material; and
after performing said second heat treatment, forming at least one further layer of said electrode material.

10. The method of claim 9, wherein introducing said first and second metal species into said first and second portions of said gate dielectric layer comprises forming a first diffusion layer above said first active region and a second diffusion layer above said second active region and performing a diffusion inducing heat treatment.

11. The method of claim 10, wherein said first metal species comprises lanthanum and said second metal species comprises aluminum.

12. The method of claim 9, wherein forming said gate dielectric layer comprises forming a high-k dielectric material above said first and second active regions.

13. The method of claim 12, further comprising performing a post-deposition heat treatment on said high-k dielectric material prior to introducing said first and second metal species.

14. The method of claim 9, wherein said first heat treatment is performed at a temperature of 400° C. or higher when exposing said gate dielectric layer to said gaseous ambient after introducing said first and second metal species.

15. A method, comprising:
forming a gate dielectric layer on an active region of a semiconductor device so as to comprise a high-k dielectric material;
performing a first post-deposition heat treatment on said gate dielectric layer;
forming a diffusion layer above said gate dielectric layer after performing said post-deposition heat treatment and inducing diffusion of a threshold voltage adjusting species into said gate dielectric layer;
exposing said gate dielectric layer by removing at least said diffusion layer;
performing a heat treatment on said exposed gate dielectric layer; forming at least one metal-containing layer above said gate dielectric layer after performing said heat treatment;
performing a second post-deposition heat treatment on said at least one metal-containing layer; and after performing said second post-deposition heat treatment, forming at least one layer of a further electrode material above said at least one metal-containing layer.

16. The method of claim 15, wherein said heat treatment is performed at a temperature of 400° C. or higher in a gaseous ambient comprising at least one of argon, nitrogen, oxygen, hydrogen, ammonia and a hydrogen/nitrogen mixture.

17. The method of claim 15, wherein said gate dielectric layer comprises a high-k dielectric material.

* * * * *

UNITED STATES PATENT AND TRADEMARK OFFICE
CERTIFICATE OF CORRECTION

| | | |
|---|---|---|
| PATENT NO. | : 8,735,240 B2 | Page 1 of 1 |
| APPLICATION NO. | : 13/455489 | |
| DATED | : May 27, 2014 | |
| INVENTOR(S) | : Kelwing et al. | |

It is certified that error appears in the above-identified patent and that said Letters Patent is hereby corrected as shown below:

In the Claims

In claim 1, at column 15, line 50, delete "last" and insert therefor -- least --.

Signed and Sealed this
Twenty-second Day of July, 2014

Michelle K. Lee
*Deputy Director of the United States Patent and Trademark Office*